(12) United States Patent
Shin et al.

(10) Patent No.: US 11,088,343 B2
(45) Date of Patent: Aug. 10, 2021

(54) ELECTRONIC DEVICE INCLUDING DISPLAY PANEL INCLUDING ELECTRODES HAVING DIFFERENT SHAPES FOR RESPECTIVE AREAS

(71) Applicant: SAMSUNG ELECTRONICS CO., LTD., Suwon-si (KR)

(72) Inventors: Sungyoung Shin, Suwon-si (KR); Yongkoo Her, Suwon-si (KR); Byungduk Yang, Suwon-si (KR); Songhee Jung, Suwon-si (KR); Hyunchang Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 16/697,933

(22) Filed: Nov. 27, 2019

(65) Prior Publication Data

US 2020/0168832 A1     May 28, 2020

(30) Foreign Application Priority Data

Nov. 28, 2018 (KR) .......................... 10-2018-0149408

(51) Int. Cl.
*H01L 51/52* (2006.01)
*H01L 27/32* (2006.01)

(52) U.S. Cl.
CPC ...... *H01L 51/5209* (2013.01); *H01L 27/3227* (2013.01); *H01L 27/3246* (2013.01);
(Continued)

(58) Field of Classification Search
CPC ............. H01L 51/5209; H01L 27/3227; H01L 27/3246; H01L 51/5225
See application file for complete search history.

(56) References Cited

U.S. PATENT DOCUMENTS 7,750,554 B2    7/2010 Shin
8,350,464 B1    1/2013 Jeong et al.
(Continued)

FOREIGN PATENT DOCUMENTS

CN    104375719    2/2015
JP    H02-37326    2/1990
(Continued)

OTHER PUBLICATIONS

International Search Report and Written Opinion dated Mar. 20, 2020 in counterpart International Application No. PCT/KR2019/016517.
(Continued)

*Primary Examiner* — Anthony Ho
(74) *Attorney, Agent, or Firm* — Nixon & Vanderhye, P.C.

(57) ABSTRACT

Disclosed is an electronic device. The electronic device may include a light-receiving sensor and a display panel and the light-receiving sensor may be disposed below a predetermined area of the display panel. The display panel may include: a pixel layer including at least one first pixel disposed in the predetermined area, and at least one second pixel disposed outside the predetermined area; and an electrode layer including at least one first electrode electrically connected to the at least one first pixel and disposed in the predetermined area, and at least one second electrode electrically connected to the at least one second pixel and disposed outside the predetermined area. The electrode layer may be disposed below the pixel layer, and the first electrode may have a shape different than a shape of the second electrode.

20 Claims, 14 Drawing Sheets

(52) U.S. Cl.
CPC ...... *H01L 51/5218* (2013.01); *H01L 51/5225* (2013.01); *H01L 51/5234* (2013.01)

(56) References Cited

U.S. PATENT DOCUMENTS

| | | | |
|---|---|---|---|
| 8,536,782 | B2 | 9/2013 | Lee et al. |
| 8,957,443 | B2 | 2/2015 | Hwang et al. |
| 9,502,689 | B2 | 11/2016 | Choi et al. |
| 9,620,571 | B2 | 4/2017 | Shedletsky et al. |
| 10,038,168 | B2 | 7/2018 | Harkema |
| 2004/0140757 | A1 | 7/2004 | Tyan et al. |
| 2010/0149077 | A1 | 6/2010 | Asano |
| 2017/0150622 | A1 | 5/2017 | Kim et al. |
| 2017/0177107 | A1 | 6/2017 | Sha |
| 2017/0256747 | A1 | 9/2017 | Lee et al. |
| 2017/0293169 | A1 | 10/2017 | Braun et al. |
| 2019/0130822 | A1 | 5/2019 | Jung et al. |
| 2019/0341435 | A1 | 11/2019 | Chang et al. |

FOREIGN PATENT DOCUMENTS

| | | |
|---|---|---|
| JP | H09-251161 | 9/1997 |
| JP | 2839829 | 12/1998 |
| JP | 2004-228082 | 8/2004 |
| JP | 2017-500715 | 1/2017 |
| JP | 6206063 | 10/2017 |
| KR | 10-0673744 | 1/2007 |
| KR | 10-2009-0087273 | 8/2009 |
| KR | 10-2011-0014865 | 2/2011 |
| KR | 10-2011-0064265 | 6/2011 |
| KR | 10-1074808 | 10/2011 |
| KR | 10-2013-0007167 | 1/2013 |
| KR | 10-2013-0125241 | 11/2013 |
| KR | 10-2014-0010306 | 1/2014 |
| KR | 10-2015-0107485 | 9/2015 |
| KR | 10-2017-0037436 | 4/2017 |
| KR | 10-2017-0113066 | 10/2017 |
| TW | 201839743 | 11/2018 |
| WO | 2017/164680 | 9/2017 |

OTHER PUBLICATIONS

Extended Search Report and Written Opinion dated Apr. 14, 2020 in counterpart European Patent Application No. EP19211827.1.
Hong et al., "Effect of electron beam irradiation on the electrical and optical properties of ITO/Ag/ITO and IZO/Ag/IZO films", Thin Solid Films, 2011, vol. 519, pp. 6829-6833.
Indian Office Action and Written Opinion dated Mar. 31, 2021 in corresponding Indian Application No. 201924048716.

ELECTRONIC DEVICE INCLUDING DISPLAY PANEL INCLUDING ELECTRODES HAVING DIFFERENT SHAPES FOR RESPECTIVE AREAS

CROSS-REFERENCE TO RELATED APPLICATION

This application is based on and claims priority under 35 U.S.C. § 119 to Korean Patent Application No. 10-2018-0149408, filed on Nov. 28, 2018, in the Korean Intellectual Property Office, the disclosure of which is incorporated by reference herein in its entirety.

BACKGROUND

1) Field

The disclosure relates to an electronic device including a display panel including electrodes having different shapes for respective areas.

2) Description of Related Art

Efforts have been made to develop a mobile electronic device, in which most of the front face thereof is capable of being used as a display in order to increase the display area while maintaining or reducing the volume thereof. When the display of an electronic device is expanded, more information may be provided in a limited size, and when a full display is applied to the front face thereof, an aesthetically pleasing feeling may be provided to a user.

As technology advances, there is a demand for a screen having the maximum size that is capable of being secured on the front face of an electronic device. Therefore, efforts have been made to increase the ratio of the area in which a screen is displayed in a display arranged in an electronic device.

In order to expand the display area to most of the front face of an electronic device, optical sensors may be disposed in the display area. When an optical sensor is disposed below the display panel, an air layer and a substrate layer of the display panel may be added above the optical sensor. When the transmittance of a sensors is lowered, the power consumption of the sensor may be increased in order to increase the intensity of emitted light.

When an optical sensor is mounted below a display panel, various schemes may be required to hinder the transmittance from being lowered due to a reflective layer, a translucent film, or an opaque area existing in the display panel.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device, the electronic device may include a light-receiving sensor and a display panel, and the light-receiving sensor may be disposed below a predetermined area of the display panel. The display panel may include: a pixel layer including at least one first pixel disposed in the predetermined area, and at least one second pixel disposed outside the predetermined area; and an electrode layer including at least one first electrode electrically connected to the at least one first pixel and disposed in the predetermined area, and at least one second electrode electrically connected to the at least one second pixel and disposed outside the predetermined area. The electrode layer may be disposed below the pixel layer, and the first electrode may have a shape different than a shape of the second electrode.

The electronic device according to various example embodiments may include a light-receiving sensor and a display panel, and the light-receiving sensor may be disposed below a predetermined area of the display panel. The display panel may include: a pixel layer including at least one first pixel included in the predetermined area, and at least one second pixel disposed outside the predetermined area; and an electrode layer including at least one first electrode electrically connected to the at least one first pixel and disposed in the predetermined area, and at least one second electrode electrically connected to the at least one second pixel and disposed outside the predetermined area. The electrode layer may be disposed below the pixel layer, and the first electrode may have an area smaller than an area of the second electrode.

An electronic device according to various example embodiments is capable of increasing the light transmittance of a sensor mounted below a display panel thereof, and thus it is possible to reduce the power consumption of the sensor.

An electronic device according to various example embodiments is capable of increasing the transmittance of light, and thus it is possible to improve the sensitivity of a sensor.

BRIEF DESCRIPTION OF THE DRAWINGS

The above and other aspects, features, and advantages of certain embodiments of the disclosure will be more apparent from the following detailed description taken, in conjunction with the accompanying drawings, in which.

DETAILED DESCRIPTION

Figure 1:
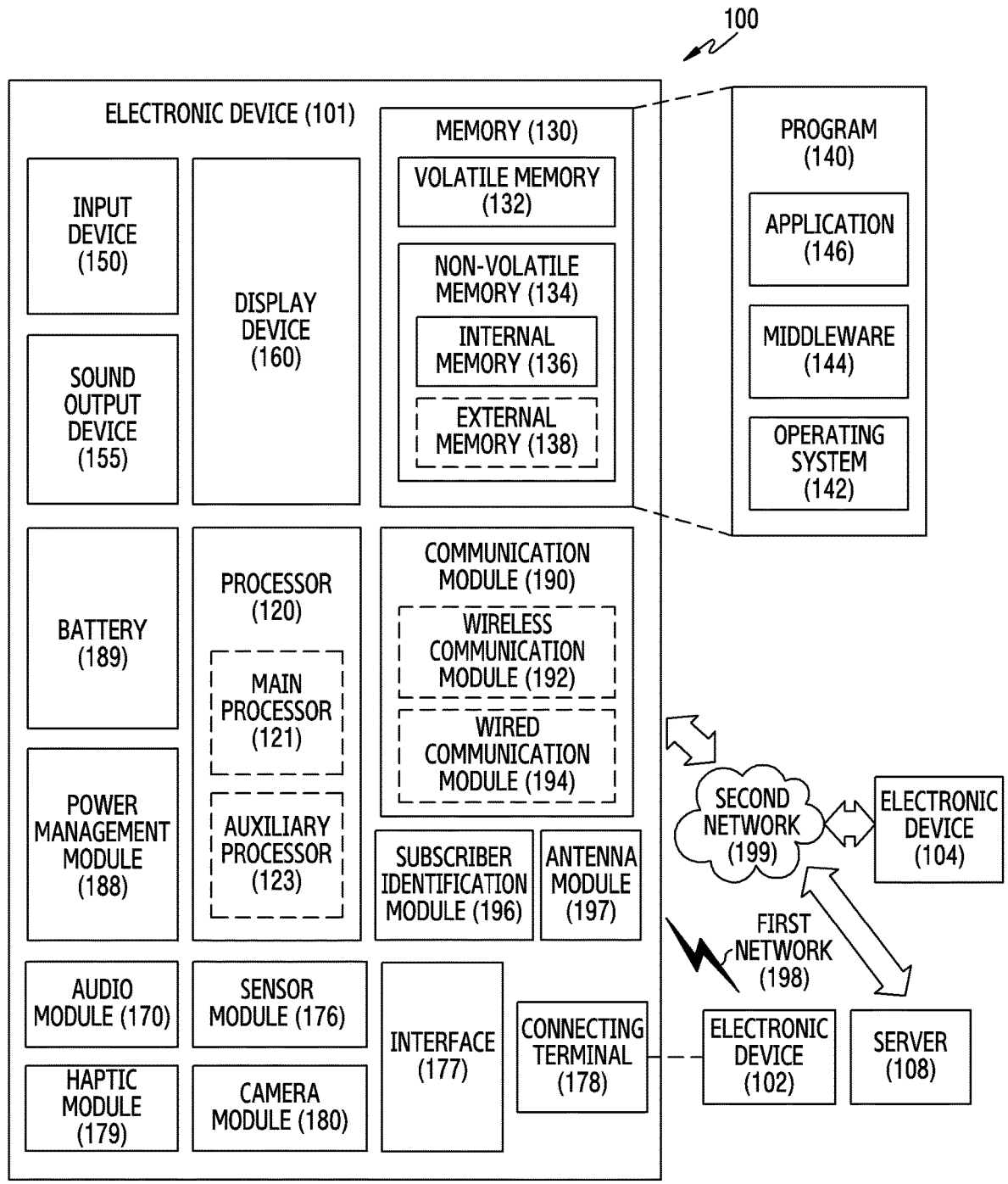
FIG. 1 is a block diagram illustrating an example electronic device, in which electrodes of pixels thereof may have different shapes, in a network environment, according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas. In such a case, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
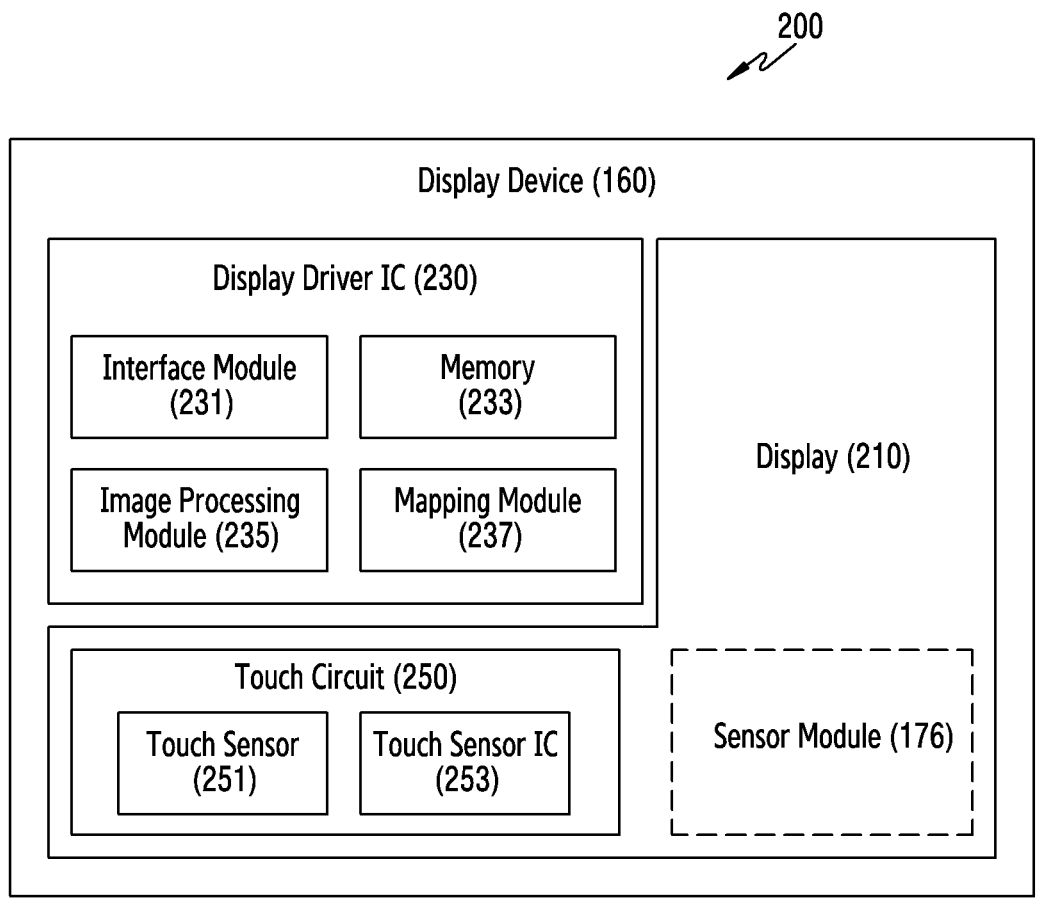
FIG. 2 is a block diagram illustrating an example display device in which electrodes related to pixels thereof have different shapes in respective areas according to various embodiments.

FIG. 2 is a block diagram 200 illustrating an example display device 160 according to various embodiments. Referring to FIG. 2, the display device 160 may include a display 210 and a display driver integrated circuit (DDI) 230 to control the display 210. The DDI 230 may include an interface module (e.g., including interface circuitry) 231, memory 233 (e.g., buffer memory), an image processing module (e.g., including image processing circuitry) 235, and/or a mapping module (e.g., including mapping circuitry) 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry (e.g., input device) 150, the sensor module 176, or the like, via the interface module 231. The DDI 230 may also store at least part of the received image information in the memory 233, for example, on a frame by frame basis.

The image processing module 235 may include various image processing circuitry and/or executable program elements and perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may include various mapping circuitry and/or executable program elements and generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. For example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be included as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, an illuminance sensor, etc.) of the sensor module 176 and/or a control circuit for the at least one sensor. The at least one sensor and/or the control circuit for the at least one sensor may be embedded in one portion of a component (e.g., the display 210, the DDI 230, or the touch circuitry 150)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 and/or the sensor module 176 may be disposed between pixels in a pixel layer of the display 210, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various example embodiments of the present disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
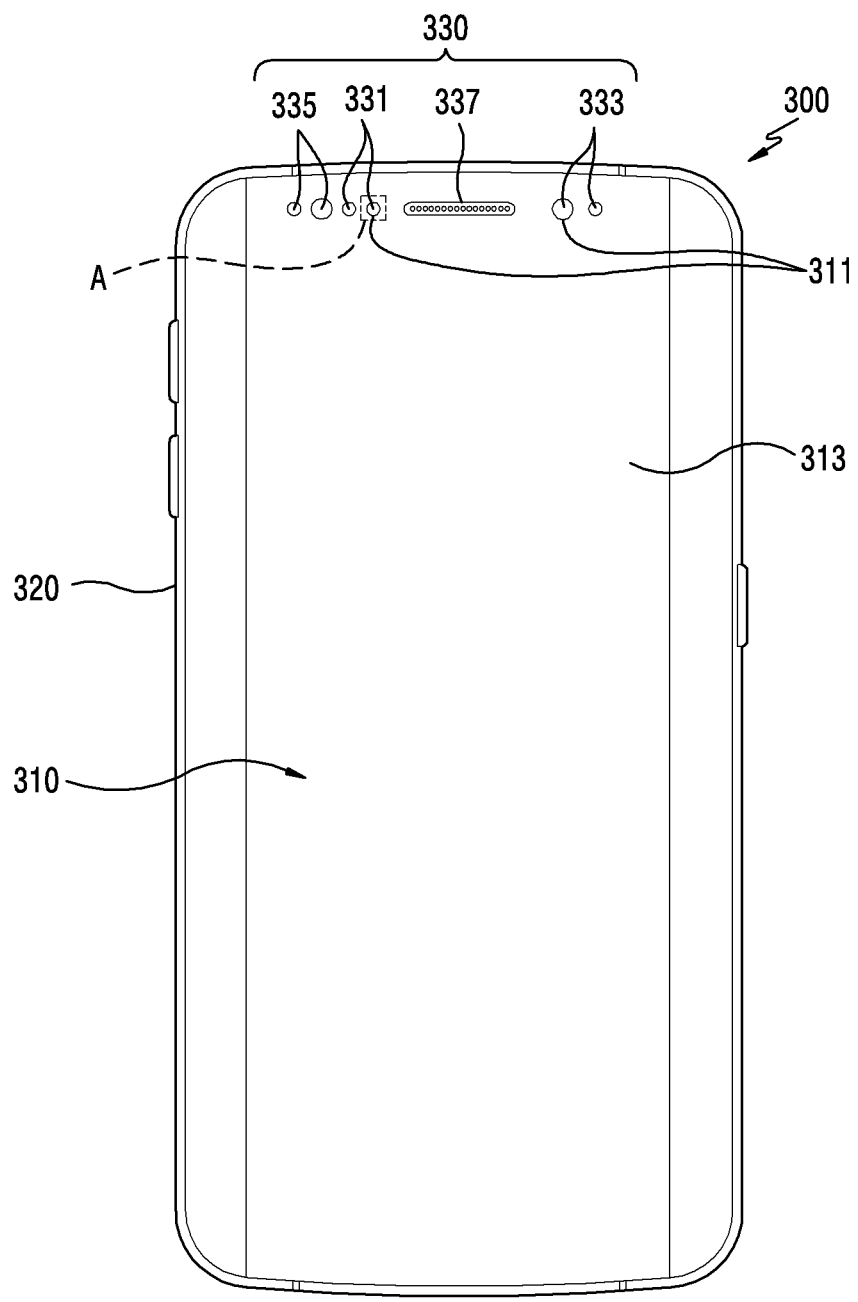
FIG. 3 is a front view illustrating an example electronic device according to various embodiments.

FIG. 3 is a front view of an example electronic device according to various embodiments.

Referring to FIG. 3, the electronic device 300 according to various embodiments may include at least one of a display 310, a front plate 320, and/or one or more sensors 330.

According to an embodiment, the display 310 may be exposed or viewable through a substantial portion of the front plate 320. For example, at least a portion of the display 310 may be exposed or viewable through the front plate 320. In various embodiments, the edges of the display 310 may be substantially the same as the outer peripheral shape of the front plate 320 adjacent thereto. Through this, substantially the entire front face of the electronic device 300 may be the screen display area of the display 310. For example, the display 310 may include, for example, and without limitation, a light-emitting diode (LED) display, an organic light-emitting diode (OLED) display, a liquid crystal display (LCD), a microelectromechanical systems (MEMS) display, an electronic paper display, or the like.

According to an embodiment, the display 310 may expose various sensors 330. The sensor(s) 330 may be disposed opposite the front plate 320 with respect to the display 310. According to various embodiments, the sensors 330 may be disposed on the rear side of the screen display area of the display 310. The sensors 330 may include, for example, and without limitation, at least one of a sensor module 331, a camera module 333, a light-emitting element 335, and an audio module 337. In some embodiments, at least some of the sensors 330 may be disposed through at least a portion of the display 310. To this end, the display 310 may include a recess or opening formed to allow the sensors 330 to be inserted therein.

According to an embodiment, the display 310 may include a first area 311 and a second area 313. The first area 311 may be a partial area of the screen display area, and may be an area corresponding to the sensors 330. The sensors 330 may be disposed below the first area 311, and the first area 311 may pass therethrough light received from the outside of the electronic device 300 to the sensor 330, or may pass therethrough light emitted from the sensors 330 to an external object and/or an external space. In some embodiments, the second area 313 may be a remaining area of the screen display area except for (or other than) the first area 311, and may display various contents (e.g., texts, images, videos, icons, or symbols). The second area 313 may include one or more pixels (not illustrated) configured to display colors. The first area 311 may also include pixels for displaying contents. The first area 311 may have a smaller number of pixels per unit area than the number of pixels in the second area 313, for example, in order to increase the transmittance of light (e.g., light reaching the sensors from outside and/or light emitted from the sensors). According to another embodiment, a reflective material (e.g., silver forming electrodes) of pixels disposed in the first area 311 may be reduced, and a transmissive material (e.g., ITO of the electrodes) may be expanded.

Figure 4:
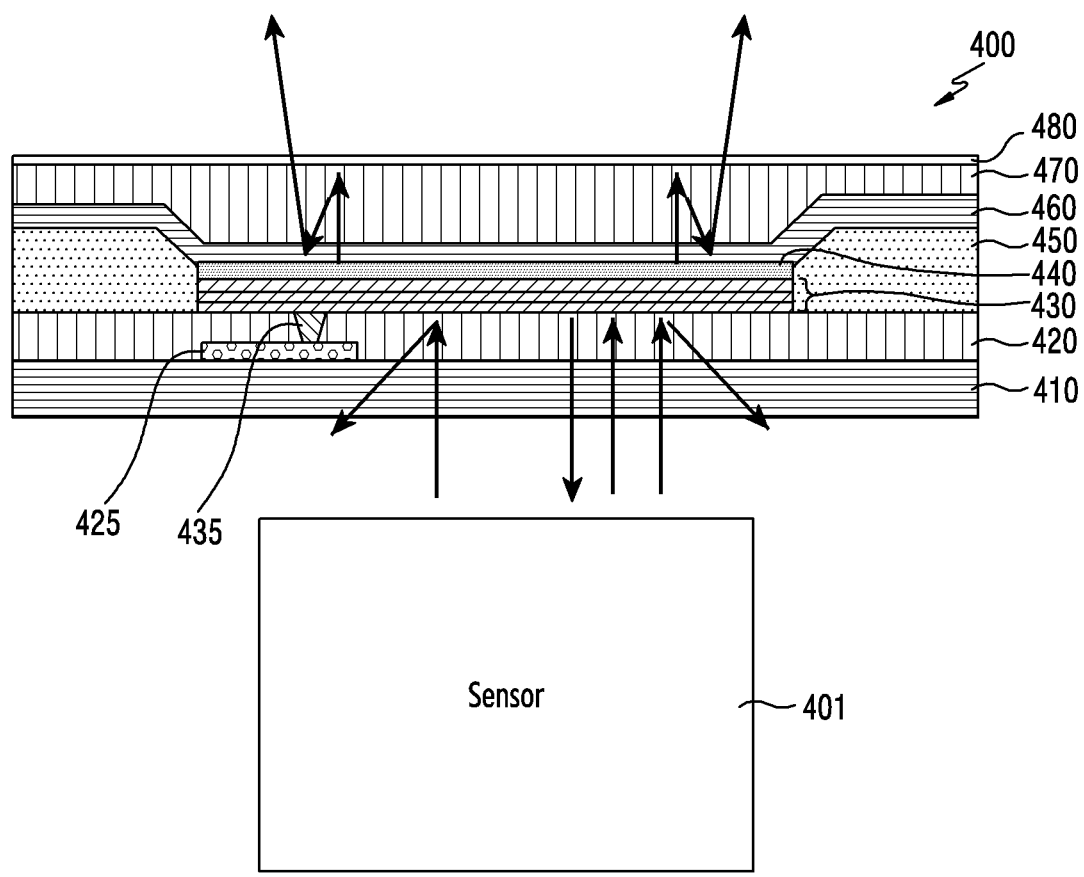
FIG. 4 is a cross-sectional view illustrating an example structure in which a sensor is disposed below a display panel according to various embodiments.

FIG. 4 is a cross-sectional view illustrating an example structure in which a sensor is disposed below a display panel according to various embodiments.

Referring to FIG. 4, a display panel 400 may include at least one of a substrate transparent layer 410, a first organic layer 420, an anode electrode 430, a light-emitting layer 440, a second organic layer 460, a third organic layer 470, and/or a cathode electrode 480.

For example, the first organic layer 420 may be laminated on the substrate transparent layer 410. The first organic layer 420 may include a drive wiring line 435 and/or a switching element 425. The first organic layer 420 and the substrate transparent layer 410 may form of a substrate. The drive wiring line 435 may be connected to at least one switch 425 or at least one anode electrode 430. The second drive wiring line 435 may extend inside the substrate, or may extend along the surface of the substrate. For example, the drive wiring line 435 may be comprise a metal material containing at least one of Al, Si, Li, Ca, or Mg.

According to various embodiments, the anode electrode 430 may include a metal material, and light may be reflected by the metal material. For example, the anode electrode 430 may include a metal layer including silver (Ag), and each of opposite faces of the metal layer may be in contact with a transparent layer. The transparent layer may include indium tin oxide (ITO). According to various embodiments, the layer formed in the middle of the anode electrode 430 may be a metal layer. In the anode electrode 430, the layer disposed between the metal layer and the first organic layer 420 may be defined as a lower transparent layer, the layer disposed between the metal layer and the second organic layer 460 may be defined as an upper transparent layer, and the layer formed between the upper transparent layer and the lower transparent may be defined as a metal layer. According to various embodiments, the cathode electrode 480 may include a metal film having a translucent property. According to an embodiment, the anode electrode 430 supplies holes, and the holes from the anode electrode 430 and the electrons from the cathode electrode 480 may be coupled to each other in the light-emitting layer 440. Exciting energy (extended energy) may be generated from the light-emitting layer 440, and the light-emitting layer 440 may emit light based on the exciting energy. The light-emitting layer 440 may generate light having a wavelength within a predetermined range (e.g., a color). For example, the light-emitting layer 440 may be an electroluminescent (EL) layer, and may include an organic light-emitting layer. At least one of the second organic material layer 460 and the third organic material layer 470 may be disposed between the cathode electrode 480 and the anode electrode 430.

According to various embodiments, the cathode electrode 480 may include a translucent film that may partially transmit light emitted from the light-emitting layer 440 to the outside, and may partially reflect the light to the anode electrode 430. When the reflected light reaches the metal layer of the anode electrode 430, the light may be reflected back to the cathode electrode 480. The reflected light beams may interfere with each other, constructive interference may occur, and a resonance phenomenon may occur. The second organic layer 460 and the third organic layer 470 may have a thickness that produces an optimal resonance frequency at which the light-emitting layer 440 is capable of generating resonance.

According to various embodiments, the sensor 401 (e.g., an optical sensor) may be disposed below the display panel 400. The sensor 401 may include at least one of a camera module (e.g., the camera module 333 in FIG. 3), a light-emitting element (e.g., the light-emitting element 335 in FIG. 3), and/or a light-receiving element.

The switching element 425, the drive wiring line 435, the anode electrode 430, and the cathode electrode 480 disposed in an area overlapping the sensor 401 may be formed of an opaque film, a reflective film, or a translucent film, and thus light loss may occur when the light emitted from an optical sensor is transmitted. For example, light emitted from the sensor 410 (e.g., an optical sensor) may be partially reflected when the light reaches the switching element 425, the drive wiring line 435, or the anode electrode 430. For example, the silver (Ag) of the anode electrode 430 may have high reflectance, so that light transmittance may be reduced. When the light passing through the anode electrode 430 reaches the cathode electrode 480 and when the cathode electrode 480 is formed of a translucent film, the light may be partially reflected to the anode electrode 430, and the remainder of the light may be transmitted.

When the light transmittance decreases, the light-emitting element may increase power consumption for emitting strong light, and an image formed of light transmitted to a light-receiving element such as a camera may be distorted. For example, the amount of light, reaching a light-receiving element included in a camera or an image sensor, may be reduced, which may deteriorate the quality or an image, and the amount of light, reaching a proximity sensor or a fingerprint sensor may be reduced, which may deteriorate the accuracy of a value detected by the sensor. In an embodiment, a partition layer (pixel defining layer (PDL)) 450 may surround side surfaces of the anode electrode 430 and the light emitting layer 440. The partition layer 450 may distinguish respective pixels.

Figure 5A:
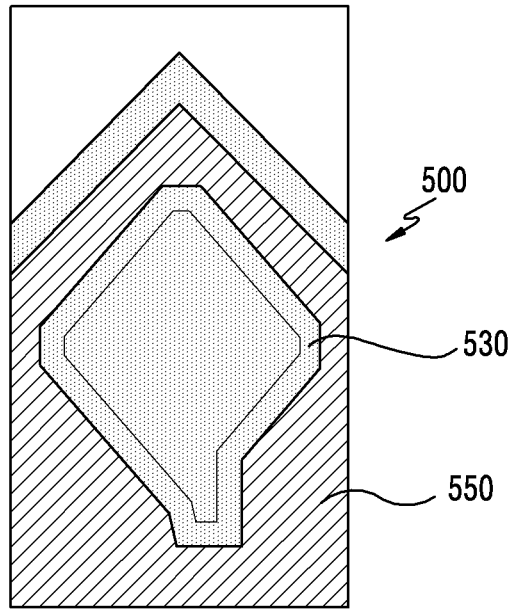
FIG. 5A is a plan view illustrating an example anode electrode of a pixel disposed in a second area of FIG. 3 according to various embodiments.
Figure 5B:
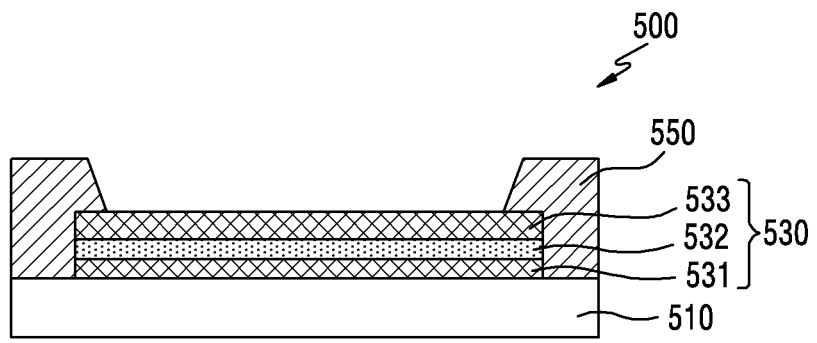
FIG. 5B is a cross-sectional view of the example anode electrode of FIG. 5A according to various embodiments.

FIG. 5A is a plan view illustrating an example anode electrode of a pixel of a display panel disposed in a second area of FIG. 3, and FIG. 5B is a cross-sectional view of the example anode electrode of FIG. 5A according to various embodiments.

Referring to FIG. 5A, a pixel 500 may include at least one anode electrode 530 and a partition member (e.g., PDL) 550.

According to various embodiments, the pixel 500 may be a single pixel included in the pixel layer disposed below the second area 313 of FIG. 3. The anode electrode 530 may provide holes, and the provided holes may be bonded to the electrons provided from the cathode electrode to emit light from the light-emitting layer. The anode electrode 530 may be enclosed by the partition member 550 along the periphery thereof. The partition member 550 may, for example, be an organic insulating material that defines the boundary between pixels during the deposition of the OLED display and prevents and/or reduces a short circuit between electrodes.

Referring to FIG. 5B, the pixel 500 may include at least one of an anode electrode 530 disposed on the substrate 510, and the anode electrode 530 may include at least one of a lower transparent layer 531, an upper transparent layer 533, and/or a metal layer 532.

According to various embodiments, the substrate 510 may be include at least one of a polymer (e.g., polyimide (PI) or plastic), an organic material, and glass. The substrate 510 may support layers of the substrate 500. The lower transparent layer 531, the metal layer 532, and the upper transparent layer 533 may be sequentially laminated on the substrate 510. The partition member 550 may be formed or provided along the edges of the laminated pixels.

According to various embodiments, the upper transparent layer 533 and the lower transparent layer 531 may comprise a transparent material, and may have conductivity. For example, the upper transparent layer 533 and the lower transparent layer 531 may include indium tin oxide (ITO).

According to various embodiments, the metal layer 532 may be disposed between the upper transparent layer 533 and the lower transparent layer 531. The metal layer 532 may include a highly reflective material having conductivity. For example, the metal layer 532 may be a highly reflective material, such as silver. When the light emitted from the light-emitting layer is reflected from or directly reaches the cathode electrode, the metal layer 532 may reflect the light to the cathode electrode. According to various embodiments, the areas of the upper transparent layer 533 and the lower transparent layer 531 may be substantially the same as the area of the metal layer 532.

Figure 6A:
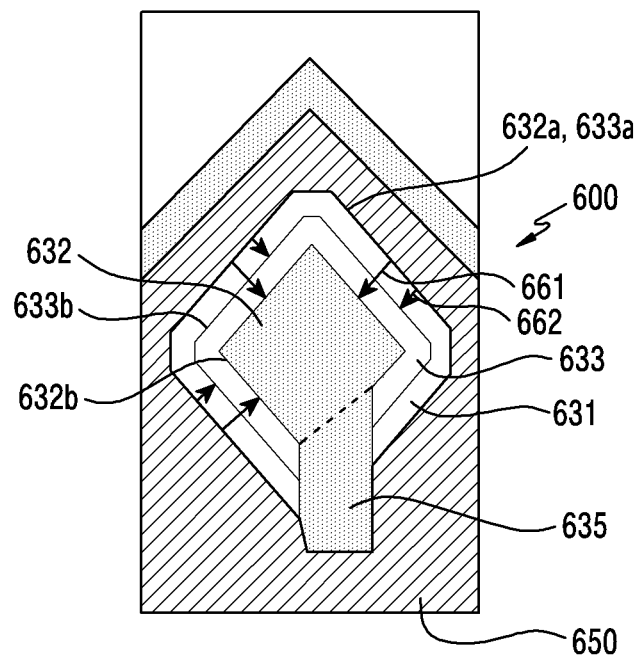
FIG. 6A is a plan view illustrating an example anode electrode of a pixel disposed in area A of FIG. 3 according to various embodiments.
Figure 6B:
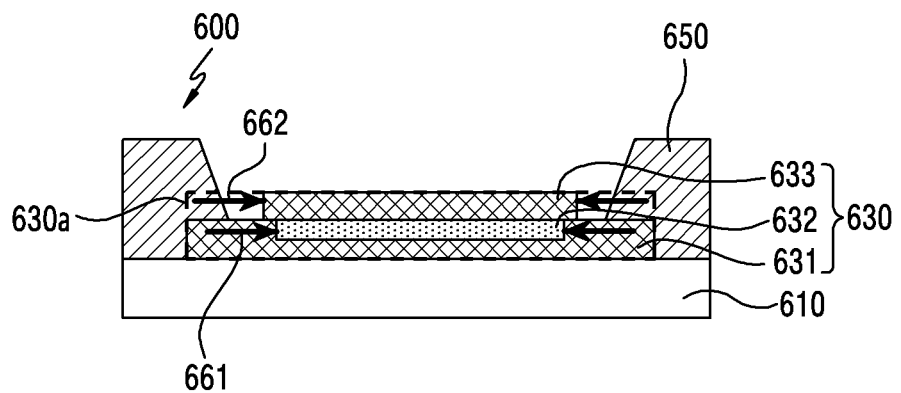
FIG. 6B is a cross-sectional view illustrating the example anode electrode of FIG. 6A according to various embodiments.

FIG. 6A is a plan view illustrating an example anode electrode of a pixel in area A of FIG. 3, and FIG. 6B is a cross-sectional view of the example anode electrode of FIG. 6A according to various embodiments.

Since the materials and characteristics of the lower transparent layer 631, the upper transparent layer 633, the metal layer 632, and the partition member 650 included in the pixel 600 of FIGS. 6A and 6B may be substantially the same as or similar to those of FIGS. 5A and 5B, a redundant description may not be repeated here.

Referring to FIGS. 6A and 6B, the pixel 600 may include an electrode 630 including at least one of a lower transparent layer 631, an upper transparent layer 633, and/or a metal layer 632 and/or a partition member 650. The pixel 600 may be disposed in an area (e.g., the area A in FIG. 3) in which a sensor (e.g., an optical sensor) is disposed below the display panel.

According to various embodiments, the area of the metal layer 632 may be smaller than the area of the metal layer (e.g., the metal layer 532 in FIG. 5A) disposed in the second area 313 in FIG. 3. In order to improve light-emission and light-receiving performance of the optical sensor disposed below the display panel, the area of the highly reflective metal layer 632 may be reduced. The metal layer 632 having the reduced area may increase light transmittance. For example, when compared with the shape 630a of the anode electrode (e.g., the anode electrode 530 in FIG. 5A) disposed in the second area (e.g., the second area 313 in FIG. 3), the areas of the metal layer 632 and the upper transparent layer 633 included in the electrode 630 disposed in the first area (e.g., the first area 311 in FIG. 3) may be reduced.

According to various embodiments, the metal layer 632, may have an area smaller than the area formed by the boundary 632a of the metal layer of the anode electrode 630a disposed in the second area 313. The metal layer 632 except for the metal layer 635 connected to the drive wiring line may have substantially the same shape as the metal layer disposed in the second area 313, and may have an area different from the metal layer disposed in the second area 313. The metal layer 632 may be reduced along the first arrows 661 inwards from the edges of the metal layer 632a disposed in the second area 313. The metal layer 632b disposed in the first area 311 may be reduced by a predetermined width from the edges of the metal layer 632a disposed in the second area 313. For example, the edges of the metal layer 632b disposed in the first area 311 may form a boundary the width of which is reduced inwards from the edges of the metal layer 632a disposed in the second area 313.

According to various embodiments, the upper transparent layer 633 may have a smaller area than the upper transparent layer disposed in the second area 313. The upper transparent layer 633 may have substantially the same shape as the boundary 633a of the upper transparent layer disposed in the second area 313, and may have an area different from that of the upper transparent layer disposed in the second area 313. The upper transparent layer 633 disposed in the first area 311 may be reduced inwards from the edges 633a of the upper transparent layer disposed in the second area 313 along the second arrows 662. The upper transparent layer 633 disposed in the first area 311 may be reduced inwards from the edges 633a of the upper transparent layer disposed in the second area 313 by a predetermined width. According to various embodiments, the area of the upper transparent layer 633 may be larger than that of the metal layer 632 in order to prevent and/or reduce the metal layer 632 from being exposed to the outside. For example, the boundary of the upper transparent layer 633 disposed in the first area 311 may surround the boundary of the metal layer 632.

According to various embodiments, the area of the metal layer 632 and the areas of the upper transparent layer 633 and the lower transparent layer 631 may be different from each other, and the side faces of the metal layer 632 may be surrounded by the upper transparent layer 633 and the lower transparent layer 631. When the metal layer 632 is exposed to the outside, the metal layer 632 may be oxidized, and when the metal layer 632 is surrounded by the upper transparent layer 633 and the lower transparent layer 631, it is possible to prevent and/or reduce the metal layer 632 from coming into contact with oxygen. In order to prevent and/or reduce oxidation of the metal layer, the metal layer 632 may be prevented from being and/or avoid being exposed to the air by adding an additional side transparent layer (not illustrated) to the side faces of the metal layer. The upper transparent layer 633, the lower transparent layer 631, and the side transparent layer may include ITO. A portion including the side faces of the lower transparent layer 631 may be surrounded by the partition member 650.

According to various embodiments, the upper transparent layer 633 and the lower transparent layer 631 may have substantially the same area, and side faces of the upper transparent layer 633 and the lower transparent layer 631 may be surrounded by the partition member 650. For example, the metal layer 632 of the electrode 630 disposed in the first area 311 may have an area smaller than that of the metal layer of the electrode 630a disposed in the second area 313. The areas of the upper transparent layer 633 and the lower transparent layer 631 may be substantially the same area as the electrode 630a disposed in the second area 313, and the portion corresponding to the reduced metal layer 632 may be filled with the upper transparent layer 633 or the lower transparent layer 631.

Figure 7A:
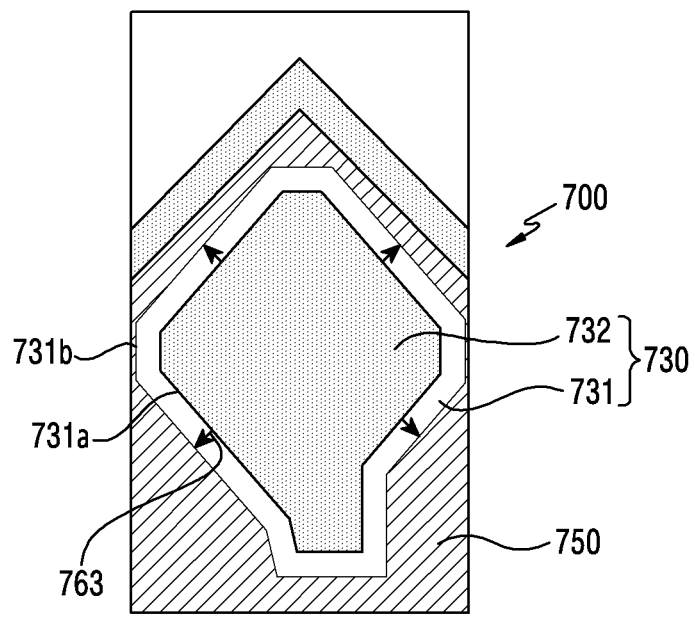
FIG. 7A is a plan view illustrating an example modification of the example anode electrode of FIG. 6A according to various embodiments.
Figure 7B:
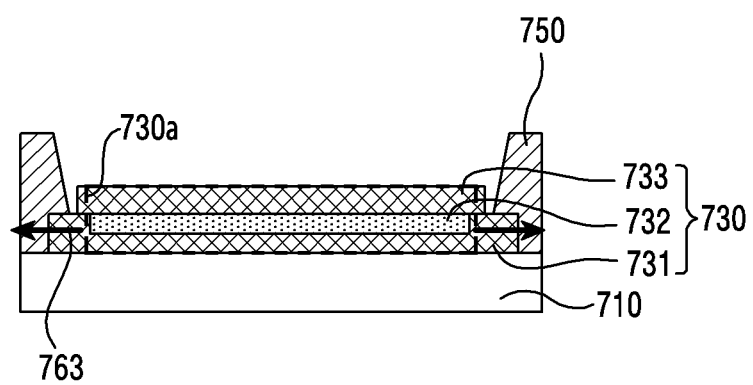
FIG. 7B is a cross-sectional view illustrating the example anode electrode of FIG. 7A according to various embodiments.

FIG. 7A is a plan view illustrating an example modification of the example anode electrode of FIG. 6A, and FIG. 7B is a cross-sectional view of the example anode electrode of FIG. 7A according to various embodiments.

Since the materials and characteristics of the lower transparent layer 731, the upper transparent layer 733, the metal layer 732, and the partition member 750 included in the pixel 700 of FIGS. 7A and 7B may be substantially the same as or similar to those of FIGS. 5A and 5B, a redundant description may not be repeated here.

Referring to FIGS. 7A and 7B, the pixel 700 may include an anode electrode 730 including a lower transparent layer 731, an upper transparent layer 733, and a metal layer 732, which are laminated on the substrate 710, and a partition member 750. The pixel 700 may be disposed in an area (e.g., the area A in FIG. 3) in which an optical sensor is disposed below the display panel.

According to various embodiments, when compared with the shape 731a of the lower transparent layer (e.g., the lower transparent layer 531 in FIG. 5A) disposed in the second area (e.g., the second area 313 in FIG. 3), the area of the lower transparent layer 731 included in the electrode 730 disposed in the first area (e.g., the first area 311 in FIG. 3) may be increased.

According to various embodiments, the lower transparent layer 731 may have a larger area than the lower transparent layer 731a disposed in the second area 313. The lower transparent layer 731 may have substantially the same shape as the boundary 731a of the lower transparent layer disposed in the second area 313, and may have an area different from that of the lower transparent layer disposed in the second area 313. The boundary 731b of the lower transparent layer 731 may be expanded (or extended) outwards from the edges of the lower transparent layer 731a disposed in the second area 313 along the third arrows 763. The lower transparent layer 731 disposed in the first area 311 may be extended by a predetermined width from the edges of the lower transparent layer 731a disposed in the second area 313. According to various embodiments, the area of the upper transparent layer 733 may be wider than that of the metal layer 732 in order to prevent and/or reduce the metal layer 732 from being exposed to the outside. For example, the upper transparent layer 733 may be extended from the edges of the electrode 730a disposed in the second area 313, and may be extended such that the metal layer 732 is not exposed. According to various embodiments, the area of the metal layer 732 may be substantially the same as the area of the metal layer 432 of the pixel (e.g., the pixel 400 in FIG. 4) disposed in the second area 313 in FIG. 3. The area of the lower transparent layer 731 may be larger than the area of the lower transparent layer (e.g., the lower transparent layer 431 in FIG. 4) disposed in the second area 313 in FIG. 3. The lower transparent layer 731 may be extended from the edges of the metal layer 732 to the partition member 750. The lower transparent layer 731 and the upper transparent layer 733 may include ITO, and the luminance of the display may be compensated by the expansion of the lower transparent layer 731. According to various embodiments, as the lower transparent layer 731 is expanded, the area in which the partition member 750 is disposed may be reduced.

According to various embodiments, the lower transparent layer 731 may be expanded to the boundary of the partition member 750. The side faces of the lower transparent layer 731 may not be in contact with the partition member 750, and the partition member 750 may, for example, be disposed only on the upper face of the lower transparent layer 731 (e.g., the face opposite the face, which is in contact with the substrate 710). For example, the partition member 750 may be disposed only on the lower transparent layer 731.

According to various embodiments, the upper transparent layer 733 and the lower transparent layer 731 may have substantially the same area, and side faces of the upper transparent layer 733 and the lower transparent layer 731 may be surrounded by the partition member 750. The areas of the upper transparent layer 733 and the lower transparent layer 731 may be larger than the area of the electrode 730a disposed in the second area 313.

According to various embodiments, the upper transparent layer 733 and the lower transparent layer 731 may be expanded to the boundary of the partition member 750. The side faces of the upper transparent layer 733 and the lower transparent layer 731 may not be in contact with the partition member 750, and the partition member 750 may be disposed only on the upper face of the upper transparent layer 733 (e.g., the face opposite the face, which is in contact with the lower transparent layer 731). For example, the partition member 750 may be disposed only on the upper transparent layer 733.

According to various embodiments, the side faces of the metal layer 732 that have not been exposed to the outside by the partition member 750 may be surrounded by the lower transparent layer 731 and the upper transparent layer 733, or an additional side transparent layer (not illustrated) may enclose the side faces of the metal layer 732.

Figure 8A:
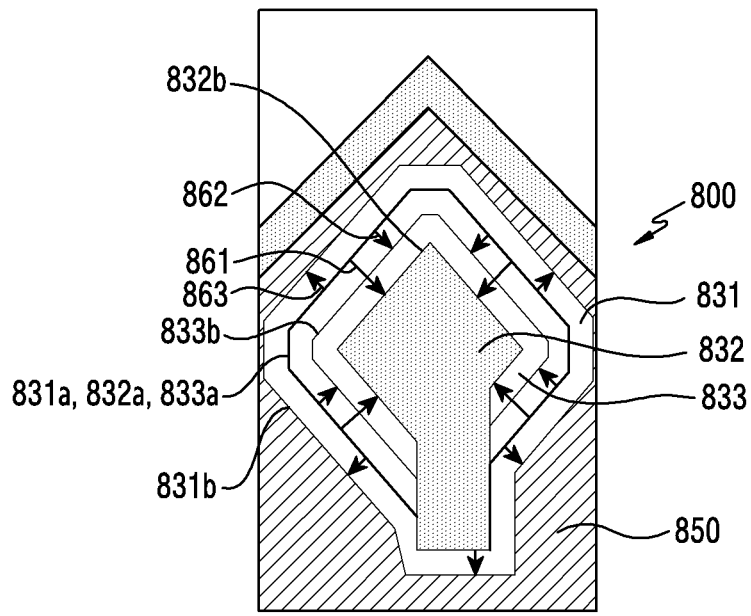
FIG. 8A is a plan view illustrating another example modification of the example anode electrode of FIG. 6A according to various embodiments.
Figure 8B:
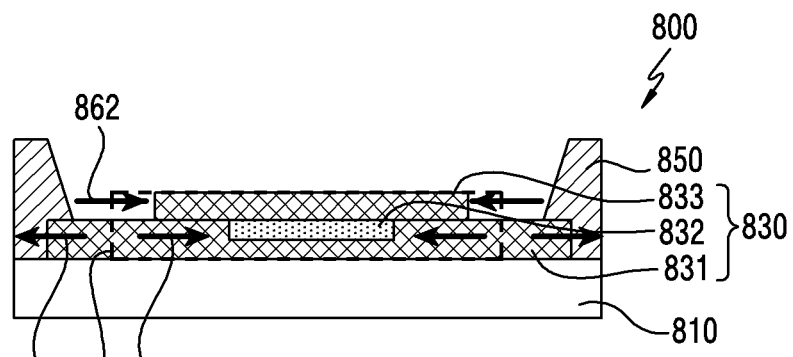
FIG. 8B is a cross-sectional view illustrating the example anode electrode of FIG. 8A according to various embodiments.

FIG. 8A is a plan view illustrating another example modification of the example anode electrode of FIG. 6A, and FIG. 8B is a cross-sectional view of the example anode electrode of FIG. 8A according to various embodiments.

Since the materials and characteristics of the lower transparent layer 831, the upper transparent layer 833, the metal layer 832, and the partition member 850 included in the pixel 800 of FIGS. 8A and 8B may be substantially the same as or similar to those of FIGS. 5A and 5B, a redundant description will be omitted.

Referring to FIGS. 8A and 8B, the pixel 800 may include an anode electrode 830 including at least one of a lower transparent layer 831, an upper transparent layer 833, and/or a metal layer 832, which are laminated on the substrate 810, and a partition member 850. The pixel 800 may be disposed in an area (e.g., the area A in FIG. 3) in which an optical sensor is disposed below the display panel.

According to various embodiments, in order to improve light-emission and light-receiving performance of the optical sensor disposed below the display panel, the area of the highly reflective metal layer 832 may be reduced. The metal layer 832 having the reduced area may increase light transmittance, and the amount of light incident from the outside to reach the optical sensor may increase.

According to various embodiments, the metal layer 832 may have an area smaller than the area formed by the boundary 832a of the metal layer of the anode electrode 830a disposed in the second area 313. The metal layer 832 except for the area connected to the drive wiring line may have substantially the same shape as the metal layer disposed in the second area 313, and may have an area different from the metal layer disposed in the second area 313. The metal layer 832 may be reduced along the first arrows 861 inwards from the edges of the metal layer 832a disposed in the second region 313. The metal layer 832b disposed in the first area 311 may be reduced by a predetermined width from the edges of the metal layer 832a disposed in the second area 313. For example, the edges of the metal layer 832b disposed in the first area 311 may form a boundary the width of which is reduced inwards from the edges of the metal layer 832a disposed in the second area 313.

According to various embodiments, the upper transparent layer 833 may have a smaller area than the upper transparent layer disposed in the second area 313. The upper transparent layer 833 may have substantially the same shape as the boundary 833a of the upper transparent layer disposed in the second area 313, and may have an area different from that of the upper transparent layer disposed in the second area 313. The upper transparent layer 833 disposed in the first area 311 may be reduced inwards from the edges 833a of the upper transparent layer disposed in the second area 313 along the second arrows 862. The upper transparent layer 833 disposed in the first area 311 may be reduced inwards from the edges 833a of the upper transparent layer disposed in the second area 313 by a predetermined width. According to various embodiments, the area of the upper transparent layer 833 may be larger than that of the metal layer 832 in order to prevent and/or reduce the metal layer 832 from being exposed to the outside. For example, the boundary 833b of the upper transparent layer 833 disposed in the first area 311 may surround the boundary 832b of the metal layer 832. The reduced area of the upper transparent layer 833 from the upper transparent layer 833a disposed in the second area 313 may be smaller than the reduced area of the metal layer 832 from the metal layer 832a disposed in the second area 313.

According to various embodiments, when compared with the shape 831a of the lower transparent layer (e.g., the lower transparent layer 531 in FIG. 5A) disposed in the second area (e.g., the second area 313 in FIG. 3), the area of the lower transparent layer 831 included in the electrode 830 disposed in the first area (e.g., the first area 311 in FIG. 3) may be increased.

According to various embodiments, the lower transparent layer 831 may have a larger area than the lower transparent layer 831a disposed in the second area 313. The lower transparent layer 831 may have substantially the same shape as the boundary 831a of the lower transparent layer disposed in the second area 313, and may have an area different from that of the lower transparent layer disposed in the second area 313. The boundary 831b of the lower transparent layer 831 may be expanded (or extended) outwards from the edges of the lower transparent layer 831a disposed in the second area 313 along the third arrows 863. The lower transparent layer 831 disposed in the first area 311 may be extended by a predetermined width from the edges of the lower transparent layer 831a disposed in the second area 313.

According to various embodiments, the area of the metal layer 831 may be wider at a ratio in a predetermined range than the area of the lower transparent layer (e.g., the lower transparent layer 431 in FIG. 4) disposed in the second area 313 in FIG. 3. The lower transparent layer 831 may be extended from the edges of the metal layer 832 to the partition member 850. The lower transparent layer 831 and the upper transparent layer 833 may include ITO, and the luminance of the display may be compensated by the expansion of the lower transparent layer 831. According to various embodiments, as the lower transparent layer 831 is expanded, the area in which the partition member 850 is disposed may be reduced.

According to various embodiments, the lower transparent layer 831 may be expanded to the boundary of the partition member 850. The side faces of the lower transparent layer 831 may not be in contact with the partition member 850, and the partition member 850 may be disposed only on the upper face of the lower transparent layer 831 (e.g., the face opposite the face, which is in contact with the substrate 810). For example, the partition member 850 may be disposed only on the lower transparent layer 831.

According to various embodiments, the upper transparent layer 833 and the lower transparent layer 831 may have substantially the same area, and side faces of the upper transparent layer 833 and the lower transparent layer 831 may be surrounded by the partition member 850. The areas of the upper transparent layer 833 and the lower transparent layer 831 may be larger than the area of the electrode 830a disposed in the second area 313.

According to various embodiments, the upper transparent layer 833 and the lower transparent layer 831 may be expanded to the boundary of the partition member 850. The side faces of the upper transparent layer 833 and the lower transparent layer 831 may not be in contact with the partition member 850, and the partition member 850 may be disposed only on the upper face of the upper transparent layer 833 (e.g., the face opposite the face, which is in contact with the lower transparent layer 831). For example, the partition member 850 may be disposed only on the upper transparent layer 833.

According to various embodiments, the side faces of the metal layer 832 that have not been exposed to the outside by the partition member 850 may be surrounded by the lower transparent layer 831 and the upper transparent layer 833, or an additional side transparent layer (not illustrated) may enclose the side faces of the metal layer 832.

Figure 9A:
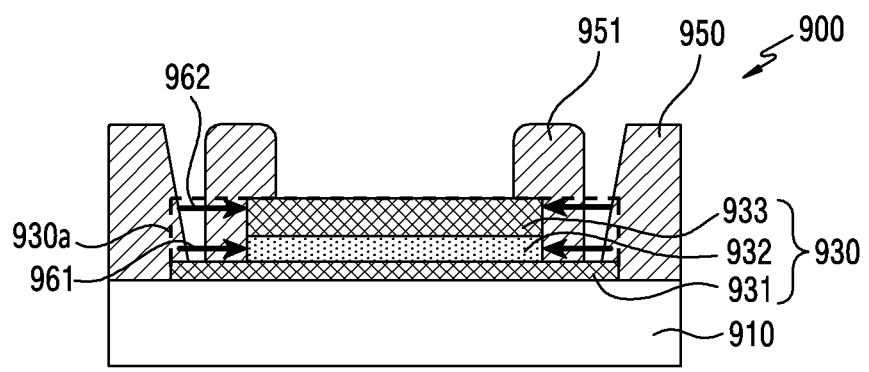
FIG. 9A is a cross-sectional view illustrating an example anode electrode including an additional PDL according to various embodiments.
Figure 9B:
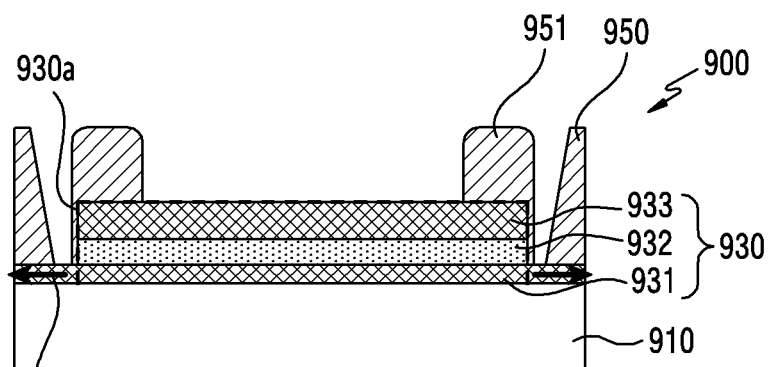
FIG. 9B is a cross-sectional view illustrating an example anode electrode including an additional PDL according to various embodiments.
Figure 9C:
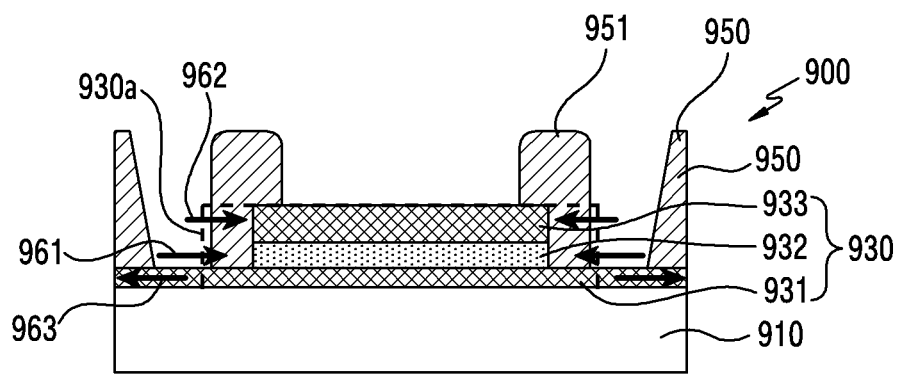
FIG. 9C is a cross-sectional view illustrating an example anode electrode including an additional PDL according to various embodiments.

FIG. 9A is a cross-sectional view illustrating an example anode electrode including an additional partition member according to various embodiments, FIG. 9B is a cross-sectional view illustrating an example anode electrode including an additional partition member according to various embodiments, and FIG. 9C is a cross-sectional view illustrating an example anode electrode including an additional partition member according to various embodiments.

An additional partition member 951 may be further included in order to prevent and/or avoid oxidation of the metal layer 932 exposed by the deformation of the anode electrode according to various embodiments.

Referring to FIG. 9A, a pixel 900 may include at least one of a lower transparent layer 931, an upper transparent layer 933, a metal layer 932, and/or a partition member 950. The pixel 900 may be disposed in an area (e.g., the area A in FIG. 3) in which an optical sensor is disposed below the display panel.

According to various embodiments, the area of the metal layer 932 may be smaller at a ratio in a predetermined range than the area of the metal layer (e.g., the metal layer 532 in FIG. 5A) disposed in the second area 313 in FIG. 3. In order to improve light-emission and light-receiving performance of the optical sensor disposed below the display panel, the area of the highly reflective metal layer 932 may be reduced. The metal layer 932 having the reduced area may increase light transmittance.

According to various embodiments, the upper transparent layer 933 and the metal layer 932 may be narrower than an electrode 930a disposed in the second area 313. The metal layer 932 may be reduced in the direction indicated by the first arrows 961 from the boundary of the electrode 930a disposed in the second area 313. The upper transparent layer 933 may be reduced in the direction indicated by the second arrows 962 from the boundary of the electrode 930a of the disposed in the second area 313. The directions in which the metal layer 932 and the upper transparent layer 933 are reduced may be the same, and the reduced widths thereof may also be the same. For example, the metal layer 932 and the upper transparent layer 933 may have the same shape, and may be reduced from electrode 930a disposed in the second area 313.

According to various embodiments, the area of the metal layer 932 may be substantially the same as that of the upper transparent layer 933, and may be smaller at a ratio in a predetermined range than the area of the lower transparent layer 931. Since the metal layer 932 is not surrounded by the upper transparent layer 933 and the lower transparent layer 931, the metal layer 932 may be exposed to the outside. When the metal layer 932 is exposed to the outside, the metal layer 932 may be oxidized. In order to prevent and/or reduce the exposure of the metal layer 932, the second partition member 951 may be included. The second partition member 951 may enclose side faces of the metal layer 932 and the upper transparent layer 933, and may enclose at least a portion of one face of the upper transparent layer 933. The area enclosed by the upper transparent layer 933 may be an edge area of the upper transparent layer 933.

According to various embodiments, the partition member 950 may enclose a portion of the lower transparent layer 931. The area enclosed by the lower transparent layer 931 may be an edge area of the lower transparent layer 931. A partition member 950 and a second partition member 951 may be disposed on a face of the lower transparent layer 933 to be spaced apart from each other.

Referring to FIG. 9B, the area of the metal layer 932 may be substantially the same as the area of the metal layer 432 of the pixel (e.g., the pixel 400 in FIG. 4) disposed in the second area 913 in FIG. 3. The area of the lower transparent layer 931 may be smaller than the area of the lower transparent layer (e.g., the lower transparent layer 431 in FIG. 4) disposed in the second area 313 in FIG. 3.

According to various embodiments, the lower transparent layer 931 may be extended from the edges of the metal layer 932 in a direction indicated by the arrows 963 toward the first partition member 950. Compared with the shape of the metal layer 930a disposed in the first area 313, the areas of the metal layer 932 and the upper transparent layer 933 may be the same. The first partition member 950 may be disposed on the lower transparent layer 931. The lower transparent layer 931 and the upper transparent layer 933 may include ITO, and the luminance of the display may be compensated by the expansion of the lower transparent layer 931. According to various embodiments, as the lower transparent layer 931 is expanded, the area in which the first partition member 950 is disposed may be reduced.

According to various embodiments, the area of the metal layer 932 may be substantially the same as that of the upper transparent layer 933, and may be smaller than that of the lower transparent layer 931. When the areas of the metal layer 932 and the upper transparent layer 933 are substantially the same, the side faces of the metal layer 932 may be exposed to the air. In order to prevent and/or reduce the metal layer 932 from being oxidized, the second partition member 951 may be included. The second partition member 951 may enclose side faces of the metal layer 932 and the upper transparent layer 933, and may enclose at least a portion of one face of the upper transparent layer 933. A partial area of the upper transparent layer 933 enclosed by the second partition member 951 may be the upper face (e.g., the face opposite the face on which the metal layer 932 is disposed) and the side faces of the edge areas of the upper transparent layer 933.

Referring to FIG. 9C, the areas of the metal layer 932 and the upper transparent layer 933 may be reduced in the pixel of FIG. 9B. According to various embodiments, the area of the metal layer 932 may be decreased, and the area of the lower transparent layer 931 may be increased. As the area of the metal layer 932 is decreased, light transmittance may be increased, and luminance may be compensated by an increase in the lower transparent layer 931.

According to various embodiments, the upper transparent layer 933 and the metal layer 932 may be narrower than an electrode 930a disposed in the second area 313. The metal layer 932 may be reduced in the direction indicated by the first arrows 961 from the boundary of the electrode 930a of the disposed in the second area 313. The upper transparent layer 933 may be reduced in the direction indicated by the second arrows 962 from the boundary of the electrode 930a of the disposed in the second area 313. The directions in which the metal layer 932 and the upper transparent layer 933 are reduced may be the same, and the reduced widths thereof may also be the same. For example, the metal layer 932 and the upper transparent layer 933 may have the same shape, and may be reduced from electrode 930a disposed in the second area 313.

According to various embodiments, the lower transparent layer 931 may be extended from the edges of the metal layer 932 in a direction indicated by the arrows 963 toward the first partition member 950. Compared with the shape of the metal layer 930a disposed in the first area 313, the areas of the metal layer 932 and the upper transparent layer 933 may be the same. According to various embodiments, in order to prevent and/or avoid the metal layer 932 from being oxidized, the second partition member 951 may be included. The second partition member 951 may enclose side faces of the metal layer 932 and the upper transparent layer 933, and may enclose at least a portion of one face of the upper transparent layer 933. A partial area of the upper transparent layer 933 enclosed by the second partition member 951 may be the upper face (e.g., the face opposite the face on which the metal layer 932 is disposed) and the side faces of the edge areas of the upper transparent layer 933.

According to various embodiments, the first partition member 950 of FIGS. 9B and 9C may enclose the edges and side faces of the upper face of the lower transparent layer 931 (e.g., the face opposite the face on which the substrate 910 is disposed). For example, the lower transparent layer 931 may be disposed such that the lower transparent layer 931 does not penetrate the first partition member 950 and the side faces of the lower transparent layer 931 are not exposed.

Figures 10A, 10B, 10C:
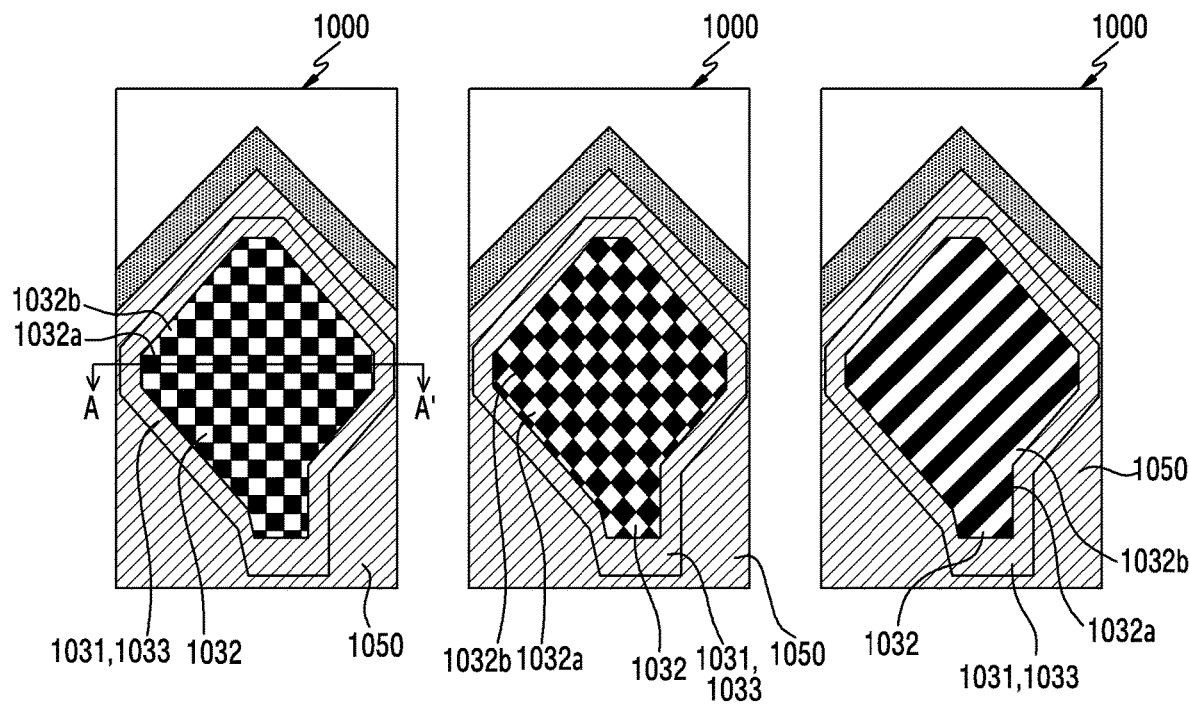
FIG. 10A is a plan view illustrating examples of various types of metal layers included in a pixel according to various embodiments.
FIG. 10B is a plan view illustrating examples of various types of metal layers included in a pixel according to various embodiments.
FIG. 10C is a plan view illustrating examples of various types of metal layers included in a pixel according to various embodiments.
Figure 10D:
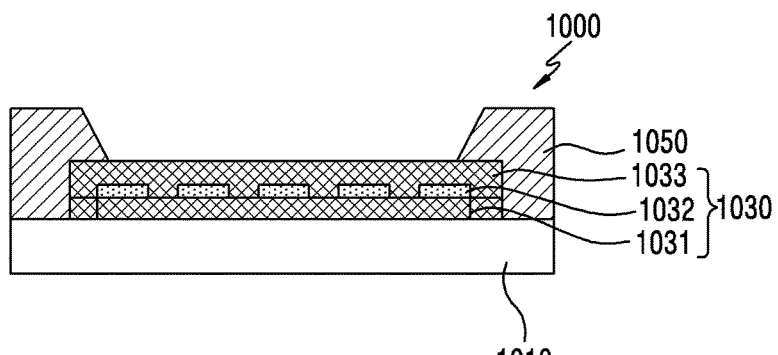
FIG. 10D is a cross-sectional view taken along line A-A' in the example pixel of FIG. 10A according to various embodiments.

FIG. 10A is a plan view illustrating various example shapes of metal layers included in pixels according to various embodiments, FIG. 10B is a plan view illustrating various example shapes of metal layers included in pixels according to various embodiments, FIG. 10C is a plan view illustrating various example shapes of metal layers included in pixels according to various embodiments, and FIG. 10D is a cross-sectional view taken along the line A-A' of the pixel in FIG. 10A according to various embodiments.

Referring to FIGS. 10A, 10B, and 10C, a pixel 1000 according to various embodiments may include at least one of a metal layer 1032, an upper transparent layer 1033, and/or a lower transparent layer 1031, and a partition member 1050 may be disposed along the edges of the pixel 1000.

According to various embodiments, the metal layer 1032 may include a metal-laminated area 1032a and a metal-non-laminated area 1032b. The metal-laminated area 1032a and the metal-non-laminated area 1032b may be disposed in a lattice pattern as the metal layer 1032 of FIGS. 10A and 10B, may be disposed in the form in which a line having a thickness is repeated like the metal layer 1032 of FIG. 10C, or may be disposed in the form in which a pattern is repeated. According to various embodiments, repeated patterns may have various shapes.

According to various embodiments, the metal layer 1032 may be formed in a shape in which a pattern is regularly repeated as well as in a shape having various patterns. The patterns formed by the metal layer 1032 may have different shapes, and may be formed of lines having various thicknesses. The lines of the patterns may become thicker or thinner toward the inside. When the pattern is formed by lines having the same thickness, lines may be arranged densely toward the center and loosely toward the edges, or vice versa.

According to various embodiments, the metal layer 1032 may include polygonal figures or circular figures such that the same shapes may be arranged concentrically. Figures of the pattern may include lines having a thickness, and the figure disposed in the center may be a solid figure.

According to various embodiments, the area of the metal layer 1032 may be reduced so as to increase transmittance.

Referring to FIG. 10D, the anode electrode 1030 of the pixel 1000 may include a metal layer 1032 including a repeated pattern on the lower transparent layer 1031. The metal layer 1033 may be enclosed by the upper transparent layer 1033, and the partition member 1050 may enclose the side faces of the anode electrode 1030 and a portion of a face opposite the face on which the substrate 1010 along the edges of the anode electrode 1030.

Figure 11A:
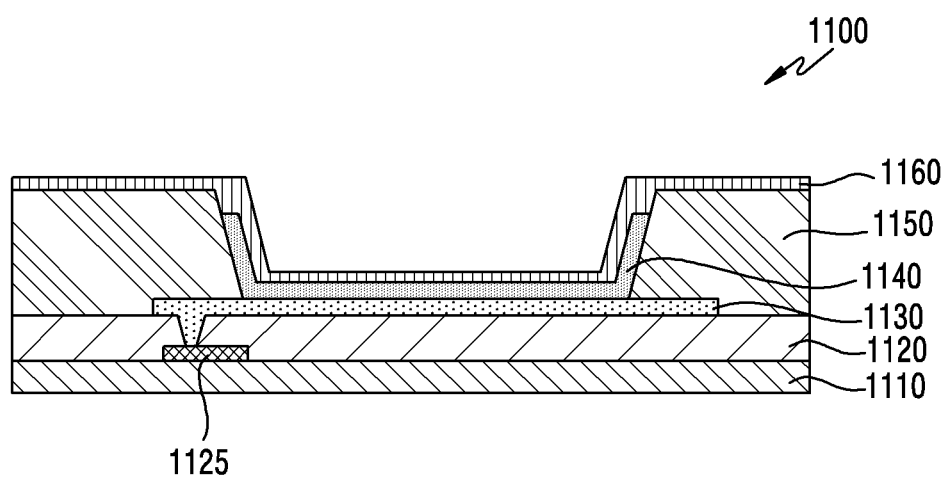
FIG. 11A is a cross-sectional view illustrating an example pixel located in an active area of a display panel according to various embodiments.

FIG. 11A is a cross-sectional view illustrating an example pixel located in an active area of a display panel according to various embodiments.

Referring to FIG. 11A, a pixel 1100 may include a substrate transparent layer 1110, a first organic layer 1120, an anode electrode 1130, a light-emitting layer 1140, and a cathode electrode 1160. The pixel 1100 of FIG. 11A may be disposed in the second area 313 of FIG. 3.

According to various embodiments, the first organic layer 1120 may be laminated on the substrate transparent layer 1110. The first organic layer 1120 may include a drive wiring line and a switching element 1125.

According to various embodiments, the anode electrode 1130 may include a metal material, and light may be reflected by the metal material having high reflectance. For example, the anode electrode 1130 may include a metal layer including silver (Ag), and each of opposite faces of the metal layer may be in contact with a transparent layer. The transparent layer may include indium tin oxide (ITO). According to various embodiments, the cathode electrode 1160 may include a metal film having a translucent property. According to an embodiment, the anode electrode 1130 supplies holes, the holes from the anode electrode 1130 and the electrons from the cathode electrode 1160 may be coupled to each other in the light-emitting layer 1140. Exciting energy may be generated from the light-emitting layer 1140, and the light-emitting layer 1140 may emit light based on the exciting energy. The light-emitting layer 1140 is able to generate light of a predetermined color.

According to an embodiment, side faces of the anode electrode 1130 and the light emitting layer 1140 may be enclosed by a partition wall (a pixel defining layer (PDL)) 1150. The partition layer 1150 may distinguish respective pixels.

Figure 11B:
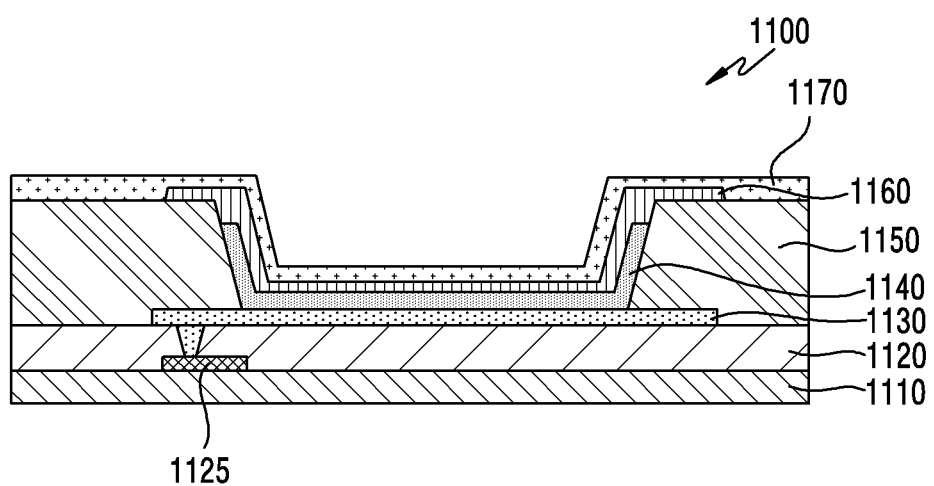
FIG. 11B is a cross-sectional view illustrating an example pixel including an additional transparent electrode in the pixel of FIG. 11A according to various embodiments.

FIG. 11B is a cross-sectional view illustrating an example pixel including an additional transparent electrode in the pixel of FIG. 11A according to various embodiments.

Referring to FIG. 11B, a transparent electrode 1170 may be further included in the pixel 1100 of FIG. 11A. Most of the display area, such as the second area 313 of FIG. 3, includes the pixel of FIG. 11A, but when an optical sensor is included below the first area 311 of FIG. 3, the display area may include the pixel 1100 of FIG. 11B.

According to various embodiments, a cathode electrode 1160 may be disposed only in an area corresponding to the light-emitting layer 1140, for example, an area in which light is emitted by the light-emitting layer 1140, and may cover one face of the transparent electrode 1170 and the cathode electrode 1160. The transparent electrode 1170 may connect adjacent cathode electrodes. The cathode electrode 1160 including the translucent film may be formed only in an area corresponding to the light-emitting layer 1140 so as to ensure light transmittance.

Figure 12A:
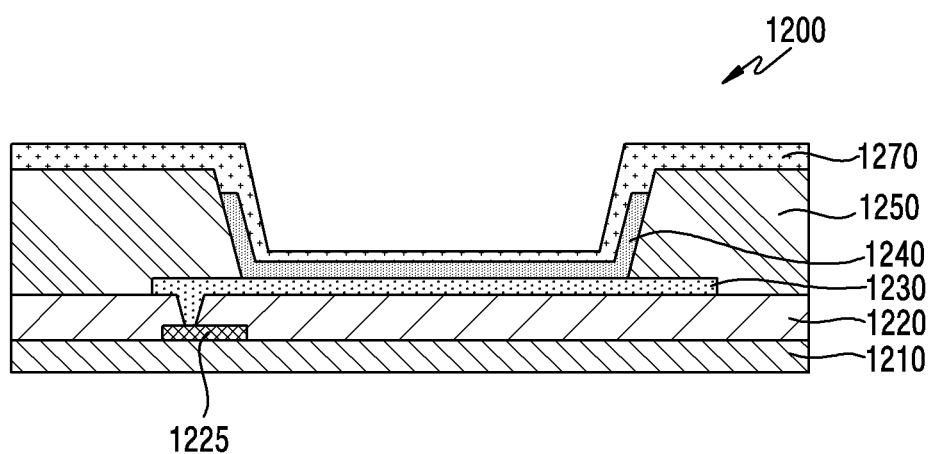
FIG. 12A is a cross-sectional view illustrating an example modification of the example pixel of FIG. 11B according to various embodiments.
Figure 12B:
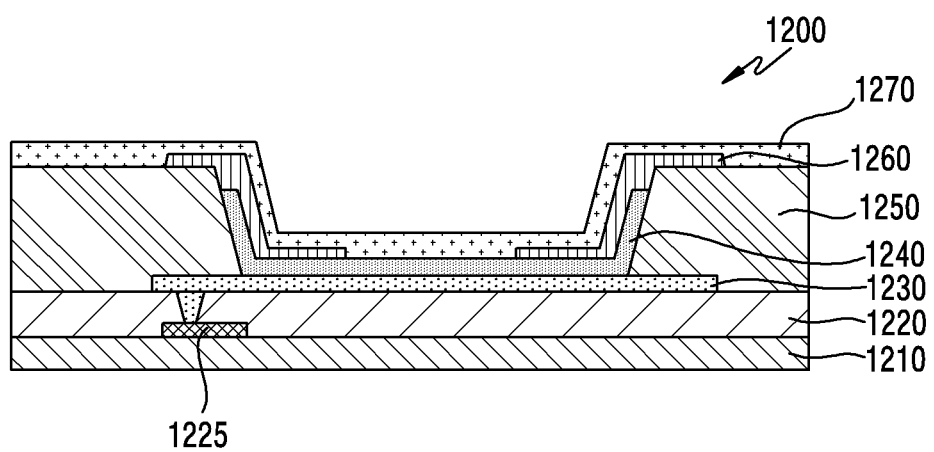
FIG. 12B is a cross-sectional view illustrating an example modification of the example pixel of FIG. 11B according to various embodiments.

FIG. 12A is a cross-sectional view illustrating an example modification of the example pixel of FIG. 11B, and FIG. 12B is a cross-sectional view illustrating an example modification of the example pixel of FIG. 11B according to various embodiments.

Referring of FIG. 12A, the cathode electrode 1160 may be removed from the pixel 1100 of FIG. 11B as in a pixel 1200, and referring to FIG. 12B, a portion of the cathode electrode 1160 may be removed. A cathode electrode 1260 may be formed of a translucent film (e.g., a translucent layer) so as to resonate the light emitted from a light-emitting layer 1240. When a sensor is disposed below the panel, transmittance may be lowered by the pixel 1200 forming the panel, and when the cathode formed of the translucent film is removed, the transmittance in the corresponding area may be increased.

According to various embodiments, when the pixel 1200 does not have the cathode electrode 1260, the light emitted from the emission layer 1240 may pass through a transparent electrode 1270 without a resonance phenomenon.

According to various embodiments, when the cathode electrode 1260 encloses a portion of the light-emitting layer 1240, the pixel 1200 may form a resonant structure and a non-resonant structure.

According to various embodiments, the pixel 1200 including the non-resonant structure has an area that does not include the cathode electrode 1260 and thus it is possible to increase the transmittance of light received or emitted by the optical sensor. The pixel 1200 may also be disposed on the optical sensor, and the display panel may also be activated on the optical sensor.

An electronic device (e.g., the electronic device 101 in FIG. 1) according to various example embodiments may include a light-receiving sensor (e.g., the sensor 401 in FIG. 4) and a display panel (e.g., the display panel 400 in FIG. 4), and the light-receiving sensor may be disposed below a predetermined area (e.g., the first area 311 in FIG. 3) of the display panel. The display panel may include: a pixel layer including at least one first pixel (e.g., the pixel 500 in FIG. 5A) included in the predetermined area, and at least one second pixel (e.g., the substrate transparent layer 410, the first organic layer 420, the anode electrode 430, the light-emitting layer 440, the second organic layer 460, the third organic layer 470, or the cathode electrode 480 in FIG. 4) disposed outside the predetermined area (e.g., the second area 313 in FIG. 3); and an electrode layer including at least one first electrode (e.g., the anode electrode 530 in FIG. 5A) electrically connected to the at least one first pixel and disposed in the predetermined area, and at least one second electrode (e.g., the anode electrode 430 in FIG. 4) electrically connected to the at least one second pixel and disposed outside the predetermined area. The electrode layer may be disposed below the pixel layer, and the first electrode may have a shape different from a shape of the second electrode.

According to various example embodiments, the first electrode may include a first reflective layer (e.g., the metal layer 532 in FIG. 5A), the second electrode may include a second reflective layer (e.g., the metal layer included in the electrode 430 in FIG. 4 or the metal layer 632a of the second area in FIG. 6A), and the first electrode may have an area that is smaller at a ratio in a predetermined range than an area of the second reflective layer.

According to various example embodiments, the first electrode may include a first upper transparent layer (e.g., the upper transparent layer 533 in FIG. 5B) disposed on one face of the first reflective layer and a first lower transparent layer (e.g., the lower transparent layer 531 in FIG. 5B) disposed on a remaining face opposite the one face of the first reflective layer, and the first reflective layer may be sandwiched by the first upper transparent layer and the first lower transparent layer.

According to various example embodiments, the first upper transparent layer may enclose at least a portion of a side face of the first reflective layer.

According to various example embodiments, the first upper transparent layer may include a protruding area corresponding to the first reflective layer.

According to various example embodiments, the second electrode may include a second upper transparent layer disposed on one face of the second reflective layer and a second lower transparent layer disposed on a remaining face opposite the one face of the second reflective layer, and the side face of the second reflective layer may be enclosed by an insulating material (e.g., the partition member 550 of FIG. 5B).

According to various example embodiments, the first lower transparent layer may have an area larger at a ratio in a predetermined range than the area of the second lower transparent layer.

According to various example embodiments, the first electrode may include a side transparent layer enclosing at least a portion of the side face of the first reflective layer.

According to various example embodiments, the first electrode may include a first upper transparent layer disposed on one face of the first reflective layer and a first lower transparent layer disposed on a remaining face opposite the one face of the first reflective layer, and the first reflective layer and the first upper transparent layer may have substantially the same shape.

According to various example embodiments, the first lower transparent layer may have an area larger at a ratio in a predetermined range than the area of the first lower transparent layer.

According to various example embodiments, the electronic device may further include: a first insulating layer (e.g., the first partition member 950 in FIG. 9A) disposed along an edge of the first lower transparent layer; and a second insulating layer (e.g., the second partition member 951 in FIG. 9A) disposed along an edge of the first upper transparent layer and enclosing side faces of the first reflective layer and the first upper transparent layer.

According to various example embodiments, the first insulating layer may enclose at least a portion of the side face of the first lower transparent layer.

According to various example embodiments, the first reflective layer may include a repeated pattern including a laminated area and a non-laminated area.

According to various example embodiments, the display device may further include a transparent electrode (e.g., the transparent electrode 1170 in FIG. 11B) enclosing at least a portion of the first electrode.

According to various example embodiments, the electronic device may further include a translucent layer (e.g., the cathode 1260 in FIG. 12B) disposed between the first electrode and the transparent electrode.

According to various example embodiments, the translucent layer may be disposed in a partial area of the first electrode.

An electronic device (e.g., the electronic device 101 in FIG. 1) according to various example embodiments may include a light-receiving sensor (e.g., the sensor 401 in FIG. 4) and a display panel (e.g., the display panel 400 in FIG. 4), and the light-receiving sensor may be disposed below a predetermined area (e.g., the first area 311 in FIG. 3) of the display panel. The display panel may include: a pixel layer including at least one first pixel (e.g., the pixel 500 in FIG. 5A) included in the predetermined area, and at least one second pixel (e.g., the substrate transparent layer 410, the first organic layer 420, the anode electrode 430, the light-emitting layer 440, the second organic layer 460, the third organic layer 470, or the cathode electrode 480 in FIG. 4) disposed outside the predetermined area (e.g., the second area 313 in FIG. 3); and an electrode layer including at least one first electrode (e.g., the anode electrode 530 in FIG. 5A) electrically connected to the at least one first pixel and disposed in the predetermined area, and at least one second electrode (e.g., the anode electrode 430 in FIG. 4) electrically connected to the at least one second pixel and disposed outside the predetermined area. The electrode layer may be disposed below the pixel layer, and the first electrode may have an area smaller than an area of the second electrode.

According to various example embodiments, the first electrode may include a first reflective layer (e.g., the metal layer 532 in FIG. 5B), a first upper transparent layer (e.g., the upper transparent layer 533 in FIG. 5B) disposed on one face of the first reflective layer and a first lower transparent layer (e.g., the lower transparent layer 531 in FIG. 5B) disposed on a remaining face opposite the one face of the first reflective layer, the first reflective layer and the upper transparent layer may have substantially the same shape, and the first lower transparent layer may have an area larger than an area of the first upper transparent layer.

According to various example embodiments, the electronic device may further include a transparent electrode enclosing at least a portion of the first electrode and a translucent layer disposed between the first electrode and the transparent electrode.

According to various example embodiments, the translucent layer may be disposed in a partial area of the first electrode.

Methods according to embodiments described in the claims or specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described example embodiments of the disclosure, a component included in the disclosure may be expressed in the singular or the plural according to a presented example embodiment. However, the singular form or plural form is selected for convenience of description suitable for the presented situation, and various example embodiments of the disclosure are not limited to a single element or multiple elements thereof. Further, either multiple elements expressed in the description may be configured into a single element or a single element in the description may be configured into multiple elements.

While the disclosure has been illustrated and described with reference to various example embodiments thereof, it will be understood by those skilled in the art that various changes in form and details may be made therein without departing from the scope of the disclosure. Therefore, the scope of the disclosure should not be defined as being limited to the various embodiments.

What is claimed is:

1. An electronic device comprising:
   a light-receiving sensor; and a display panel, the light-receiving sensor being disposed below a predetermined area of the display panel, wherein the display panel includes:

a pixel layer including at least one first pixel disposed in the predetermined area, and at least one second pixel disposed outside the predetermined area; and an electrode layer including at least one first electrode electrically connected to the at least one first pixel and disposed in the predetermined area, and at least one second electrode electrically connected to the at least one second pixel and disposed outside the predetermined area, the electrode layer being disposed below the pixel layer, and wherein the first electrode has a shape different than a shape of the second electrode.

2. The electronic device of claim 1, wherein the first electrode includes a first reflective layer, the second electrode includes a second reflective layer, and the first electrode has an area that is smaller at a ratio in a predetermined range than an area of the second reflective layer.

3. The electronic device of claim 2, wherein the first electrode includes a first upper transparent layer disposed on one face of the first reflective layer and a first lower transparent layer disposed on a remaining face opposite the one face of the first reflective layer, and the first reflective layer is enclosed by the first upper transparent layer and the first lower transparent layer.

4. The electronic device of claim 3, wherein the first upper transparent layer encloses at least a portion of a side face of the first reflective layer.

5. The electronic device of claim 4, wherein the first upper transparent layer includes a protruding area corresponding to the first reflective layer.

6. The electronic device of claim 3, wherein the second electrode includes a second upper transparent layer disposed on one face of the second reflective layer and a second lower transparent layer disposed on a remaining face opposite the one face of the second reflective layer, and a side face of the second reflective layer is enclosed by an insulating material.

7. The electronic device of claim 6, wherein the first lower transparent layer has an area larger at a ratio in a predetermined range than an area of the second lower transparent layer.

8. The electronic device of claim 3, wherein the first electrode includes a side transparent layer enclosing at least a portion of a side face of the first reflective layer.

9. The electronic device of claim 2, wherein the first electrode includes a first upper transparent layer disposed on one face of the first reflective layer and a first lower transparent layer disposed on a remaining face opposite the one face of the first reflective layer, and the first reflective layer and the first upper transparent layer have substantially a same shape.

10. The electronic device of claim 9, wherein the first lower transparent layer has an area larger at a ratio in a predetermined range than an area of the first upper transparent layer.

11. The electronic device of claim 10, further comprising:

a first insulating layer disposed along an edge of the first lower transparent layer; and a second insulating layer disposed along an edge of the first upper transparent layer and enclosing side faces of the first reflective layer and the first upper transparent layer.

12. The electronic device of claim 11, wherein the first insulating layer encloses at least a portion of the side face of the first lower transparent layer.

13. The electronic device of claim 2, wherein the first reflective layer includes a repeated pattern including a laminated area and a non-laminated area.

14. The electronic device of claim 1, further comprising:

a transparent electrode enclosing at least a portion of the first electrode.

15. The electronic device of claim 14, further comprising:

a translucent layer disposed between the first electrode and the transparent electrode.

16. The electronic device of claim 15, wherein the translucent layer is disposed in a partial area of the first electrode.

17. An electronic device comprising:

a light-receiving sensor; and a display panel, the light-receiving sensor being disposed below a predetermined area of the display panel, wherein the display panel includes:

a pixel layer including at least one first pixel disposed in the predetermined area, and at least one second pixel disposed outside the predetermined area; and an electrode layer including at least one first electrode electrically connected to the at least one first pixel and disposed in the predetermined area, and at least one second electrode electrically connected to the at least one second pixel and disposed outside the predetermined area, the electrode layer being disposed below the pixel layer, and wherein the first electrode has an area smaller than an area of the second electrode.

18. The electronic device of claim 17, wherein the first electrode includes a first reflective layer, a first upper transparent layer disposed on one face of the first reflective layer and a first lower transparent layer disposed on a remaining face opposite the one face of the first reflective layer, the first reflective layer and the first upper transparent layer have substantially a same shape, and the first lower transparent layer has an area larger than an area of the first upper transparent layer.

19. The electronic device of claim 17, further comprising:

a transparent electrode enclosing at least a portion of the first electrode; and a translucent layer disposed between the first electrode and the transparent electrode.

20. The electronic device of claim 19, wherein the translucent layer is disposed in a partial area of the first electrode.

* * * * *